United States Patent [19]

Togari et al.

[11] Patent Number: 4,540,953

[45] Date of Patent: Sep. 10, 1985

[54] GAIN CONTROL CIRCUIT FOR OBTAINING A CONSTANT OUTPUT SIGNAL AMPLITUDE BY ATTENUATING AN INPUT SIGNAL AMPLITUDE

[75] Inventors: Hisashi Togari; Shinji Miyata, both of Tokyo, Japan

[73] Assignee: Nippon Electric Company, Ltd., Japan

[21] Appl. No.: 470,131

[22] Filed: Feb. 28, 1983

[30] Foreign Application Priority Data

Feb. 26, 1982 [JP] Japan .................. 57-30329

[51] Int. Cl.³ .............................................. H03G 3/20
[52] U.S. Cl. ..................................... 330/284; 330/279
[58] Field of Search .................. 330/86, 218, 279, 284, 330/285

[56] References Cited
FOREIGN PATENT DOCUMENTS 2025720  1/1980  Japan .................. 330/279

Primary Examiner—James B. Mullins
Assistant Examiner—G. Wan
Attorney, Agent, or Firm—Ostrolenk, Faber, Gerb & Soffen

[57] ABSTRACT

A gain control circuit is disclosed. In accordance with the preferred embodiment of the invention, a negative feedback amplifier is connected between a reference voltage and a variable impedance circuit which controls the voltage to the input of a signal amplifier whose output defines the desired output voltage. The variable impedance circuit varies the input voltage to the signal amplifier as a function of the level of the output voltage appearing at the output of the signal amplifier. The output impedance of the negative feedback amplifier is chosen such that an A.C. signal appearing at its output end can be sufficiently attenuated. As a result, the input impedance to the variable impedance circuit is negligibly small with respect to an A.C. signal. As a result, the amplitude of the input signal is varied over a wide range in response to the impedance of the variable impedance circuit.

9 Claims, 4 Drawing Figures

GAIN CONTROL CIRCUIT FOR OBTAINING A CONSTANT OUTPUT SIGNAL AMPLITUDE BY ATTENUATING AN INPUT SIGNAL AMPLITUDE

BACKGROUND OF THE INVENTION

The present invention relates to an automatic gain control circuit (hereinafter called simply AGC circuit) in which an amplitude of an output signal is maintained constant despite variations in the amplitude of an input signal applied to the AGC circuit.

Among known AGC circuits, a circuit has been used in which the amplitude of an output signal is maintained constant without directly varying the gain of an amplifier amplifying an input signal applied to the circuit. To that end, a variable impedance circuit is utilized, in which a control signal is applied to its first input and an impedance between its second and third terminals is varied in response to the control signal. The output of an amplifier with a fixed gain is converted into D.C. level and applied to the first terminal of the variable impedance circuit as the control signal. The input signal for the amplifier is attenuated, before being applied to the amplifier, by the impedance between the second and third terminals of the variable impedance circuit. As the input signal amplitude is increased, the control signal derived from the amplifier varies the impedance of the variable impedance circuit to increase the amount of attenuation against the input signal amplitude. As the input signal amplitude becomes small, the impedance of the variable inpedance circuit is varied to decrease the attenuation amount of the input signal amplitude. Thus, the output signal amplitude can be made substantially constant independently of the variations in the input signal amplitude.

The variation in the impedance between the second and third terminals of the variable impedance serves to vary the input signal amplitude, but this variation should not change the input bias voltage of the amplifier. If the input bias voltage is changed, an intended amplification operation cannot be realized. Accordingly, the variable impedance circuit is normally connected to the input terminal of the amplifier through a capacitor to cut any D.C. component. However, the D.C.-cutting capacitor must have a large capacity, and therefore, it cannot be formed within a monolithic semiconductor integrated circuit. For this reason, the D.C.-cutting capacitor is connected to external lead terminals of an integrated circuit device as an externally provided part executing a circuit operation jointly with the integrated circuit. An increase in the number of the externally provided parts causes an increase in external lead terminals of the integrated circuit device, resulting in increase in a cost of the AGC integrated circuit device as well as a degradation of the reliability of the electrical and mechanical connection with the externally provided parts.

One possible structure which avoids the need for the D.C.-cutting capacitor to D.C.-couple the variable impedance circuit to the input terminal of the amplifier without varying the input bias voltage is as follows. The second and third terminals of the variable impedance circuit are respectively D.C.-connected to the input terminal of the amplifier and reference voltage generation circuit generating a reference voltage which defines an input bias of the amplifier. A means for supplying the input bias voltage is connected in parallel with the variable impedance circuit between the reference voltage generation circuit and the input terminal of the amplifier, and the current flowing therethrough is so small that the voltages at the second and third terminals of the variable impedance circuit are substantially equal to each other even if an impedance variation arises between the second and third terminals. Accordingly, the input bias voltage supplied to the input terminal of the amplifier is not substantially affected by the impedance variation of the variable impedance circuit. Since the input signal is an A.C. signal, it is attenuated in accordance with the impedance between the second and third terminals of the variable impedance circuit. In this way, the variable impedance circuit can be D.C.-coupled to the input terminal of the amplifier.

However, the output impedance of the reference voltage generation circuit is not zero. Rather, it has a certain finite value. Consequently, the input signal cannot be sufficiently attenuated even when the impedance between the second and third terminals of the variable impedance circuit takes the lowest value in response to the control signal applied to its first terminal. In other words, the gain control range is narrowed.

SUMMARY OF THE INVENTION

It is therefore an object of the present invention to provide a gain control circuit having a wide gain control range, in which a variable impedance circuit is D.C.-coupled to an input terminal of an amplifier.

Another object of the present invention is to provide a gain control circuit having a wide gain control range which is suitable to be formed in an integrated circuit.

The gain control circuit according to the present invention comprises an amplifier amplifying an input signal, a variable impedance circuit for attenuating the amplitude of the input signal which is D.C.-coupled to the input terminal of the amplifier at its one end, a reference voltage generation circuit, an additional amplifier inserted between the reference voltage generation circuit and the variable impedance circuit, and a bias voltage supplying means coupled between the additional amplifier and the input terminal of the amplifier. The variable impedance circuit has a control end and the impedance between one and the other ends is varied in response to a gain control signal fed to the control end from the output of the amplifier. The input end of the additional amplifier is connected to the reference voltage generation circuit and the output end is connected to the bias voltage supplying means and the variable impedance circuit. Therefore, the bias voltage is fed to the input terminal of the amplifier from the reference voltage generation circuit through the additional amplifier, the bias voltage supplying means and the electrical path between the one and the other ends of the variable impedance circuit. The additional amplifier has such an output impedance that an A.C. signal appearing at its output end, or at the "other" end of the variable impedance circuit, can be sufficiently attenuated. In other words, the additional amplifier has an extremely small A.C. output impedance.

The gain control circuit according to the present invention comprises the additional amplifier provided between the reference voltage generation circuit and the variable impedance circuit. Accordingly, the impedance of the reference voltage generation circuit does not contribute to the attenuation of the input signal amplitude. The amplitude of the input signal is controlled by the impedance of the variable impedance circuit and the output impedance of the additional amplifier. Since the output impedance of the additional amplifier is chosen such that an A.C. signal appearing at its output end can be sufficiently attenuated, the impedance at the "other" end of the variable impedance circuit is negligibly small with respect to an A.C. signal. Consequently, the amplitude of the input signal is varied over a wide range in response to the impedance of the variable impedance circuit.

The reference voltage by the reference voltage generation circuit appears at the output end of the additional amplifier. Since the current flowing into the input terminal of the amplifier from the output end of the additional amplifier is negligibly small, the voltages at the one and the other ends of the variable impedance circuit are substantially equal to each other regardless of the impedance between those ends. The bias voltage at the input terminal of the amplifier is substantially constant despite variations in the impedance of the variable impedance circuit which is caused by the gain control signal applied to the control end thereof.

As described above, the variable impedance circuit can be D.C. coupled to the amplifier, according to the present invention, and a wide gain control range can be attained. Due to the D.C. coupling, it is easy to form the gain control circuit of the present invention as a monolithic integrated circuit.

The additional applifier having a sufficiently low A.C. output impedance can be formed simply by employing a negative feedback amplifier of the parallel feedback type. A negative feedback amplifier is classified into four types in accordance with type of the negative feedback. Broadly it is classified into two types according to how a negative feedback signal is derived from the amplifier, and further into other two types according to how the negaive feedback signal is applied to the amplifier. Thus, there are the parallel feedback type negative feedback amplifier and the serial feedback type amplifier in which the feedback signal is derived from the output of the amplifier in parallel and in serial, respectively. There are also those of the parallel injection type and the serial injection type where the derived feedback signal is injected to the input circuit of the amplifier in parallel and in series, respectively. To sum up the foregoing, the negative feedback amplifier have four types in accordance with the manners of deriving and injecting the feedback signal. For example, one is a negative feedback amplifier of the parallel feedback and serial injection type, where the feedback signal is derived in parallel from the output circuit and injected in series to the input circuit. The other three are those of the parallel feedback and parallel injection type, the serial feedback and parallel injection type, and the serial feedback and serial injection type.

With respect to the characteristics of the output and input impedances of the negative feedback amplifier based on the difference in the manner of the negative feedback, the output impedance is decreased by employing the parallel feedback, but increased when the serial feedback is employed, while the input impedance is reduced by attaining the parallel injection, but increased by the serial injection. Further, as the parallel feedback quantity is increased, the output impedance of the amplifier becomes sufficiently low.

Therefore, by utilizing a negative feedback amplifier of the parallel feedback type as the additional amplifier, and by performing a sufficient parallel feedback, the additional amplifier has the output impedance capable of sufficiently attenuating an A.C. signal appearing at its output end.

A negative feedback amplifier in which a feedback signal having the same level as an output signal is derived in parallel and fed back to an input side totally, has a substantially zero A.C. output impedance. Such a negative feedback amplifier is called a total feedback amplifier or a voltage follower. The total feedback amplifier generates an output voltage substantially equal to an input voltage. Accordingly, the use of the total feedback amplifier as the additional amplifier produces excellent effects on the realization of a wide gain control range and the establishment of an input bias voltage.

BRIEF DESCRIPTION OF THE DRAWINGS

The above-mentioned and other objects, features and advantages of the present invention will become more apparent from the following description taken in conjunction with the accompanying drawings, wherein.

DETAILED DESCRIPTION OF THE PRIOR ART

Figure 1:
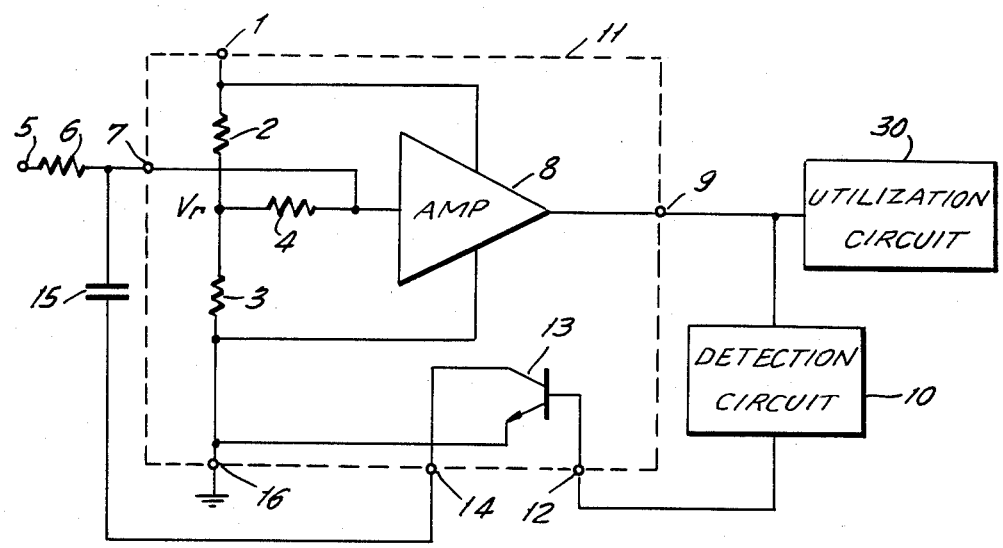
FIG. 1 is a circuit diagram of a prior art AGC circuit of the type which maintains the amplitude of an output signal constant by attenuating the amplitude of an input signal using a variable impedance circuit.

A prior art AGC circuit of the type which maintains the output signal amplitude constant by attenuating the amplitude an input signal applied thereto, is illustrated in FIG. 1. In this figure, the portion 11 framed by a dotted line is constructed as an integrated circuit. A voltage at a power supply terminal 1 is divided by resistors 2 and 3 connected in series to generate a reference voltage Vr at the junction point between these resistors. A resistor 4 is connected between the junction point of the resistors 2 and 3 and an input terminal 7 of an amplifier 8 to supply an input bias voltage to the amplifier 8. An input signal applied to a signal terminal 5 is supplied to a variable attenuator consisting of a resistor 6 and a transistor 13, and also to the input terminal 7 of the amplifier 8 which amplifies the input signal to generate an output signal at an output terminal 9. The output signal of the amplifier 8 is supplied to a utilization circuit 30 and to a detection circuit 10 which generates a gain control signal. This gain control signal is applied to the base of the transistor 13 via a gain control terminal 12 to control the collector-emitter impedance of the transistor 13. Accordingly, the transistor 13 constitutes a variable impedance circuit, and its collector (the one end)-emitter (the other end) impedance is varied in response to the gain control signal applied to it base (the control end). The degree of attenuation of the variable attenuator consisting of the resistor 6 and the transistor 13 is varied depending upon the collector-emitter impedance of the transistor 13, and therefore is controlled by the amplitude of the output signal of the amplifier 8. In other words, the amplitude of the input signal to be supplied to the amplifier, is limited to a certain constant level, the result that an output signal having a substantially constant amplitude is generated.

The emitter of the transistor 13 is connected to a ground terminal 16, and the collector of the same transistor is connected to the input terminal 7 via a D.C.-cutting (filtering) capacitor 15. If the collector of the transistor 13 is D.C. coupled to the input terminal 7, the bias voltage at the input terminal 7 would be varied in accordance with the variation of the collector-emitter impedance of the transistor 13. The capacitor 15 is provided for D.C. blocking purposes and should have a low impedance in the audio frequency band. As a result, the capacity of the capacitor 15 becomes considerably large. Consequently, the capacitor 15 cannot be formed within the integrated circuit 11, and is externally connected between the terminals 7 and 14 of the integrated circuit 11 as an externally provided part. For this capacitor 15 to be connected to the collector of the transistor 13, the lead terminal 14 should be provided in the integrated circuit 11.

As described above, the prior art AGC circuit shown in FIG. 1 necessitates that the D.C. blocking capacitor 15 be externally provided part of the integrated circuit 11, and further necessitates the external lead terminal 14 for the capacitor 15. To increase the number of externally provided parts and/or external lead terminals increases the cost of the circuit. In addition, the connections of the capacitor 15 to the lead terminals 7 and 14 and of the lead terminals 7 and 14 to the integrated circuit chip may lower the reliability of the integrated circuit 11.

Figure 2:
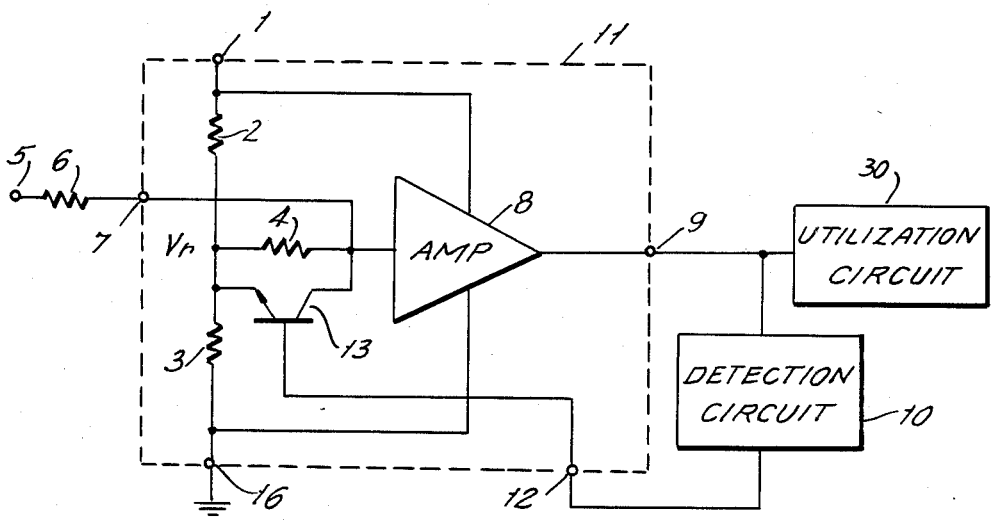
FIG. 2 is a circuit diagram of an AGC circuit in which the circuit shown in FIG. 1 is improved so as to make it suitable for forming in an integral circuit.

FIG. 2 shows an AGC circuit which improves the circuit shown in FIG. 1 by avoiding the need for the capacitor 15. In FIG. 2, component parts corresponding to those shown in FIG. 1 are denoted by like reference numerals, and further description thereof will be omitted. The difference from the circuit shown in FIG. 1 is in that the collector-emitter path of the transistor 13 is connected in parallel to the resistor 4. In other words, the collector of the transistor 13 is D.C. connected to the input terminal 7, and its emitter is connected to the junction point of the resistors 2 and 3 where a reference voltage Vr is generated. The current flowing from this junction point into the amplifier 8 is negligibly small. Therefore, the input bias voltage to the amplifier 8 is not substantially changed even when the collector-emitter impedance of the transistor 13 is varied in response to the gain control signal. The input signal applied to the input terminal 7 is attenuated by means of the resistor 6 and the collector-emitter impedance of the transistor 13, and then fed to amplifier 8. As a result, an output signal having a substantially constant amplitude is generated at the output terminal 9.

Accordingly, the AGC circuit shown in FIG. 2 does not necessitate the external lead terminal 14 as well as the capacitor 15. In other words, the AGC circuit shown in FIG. 2 has the advantages of reduced cost and high reliability compared with the circuit shown in FIG. 1.

However, the attenuation quantity of the input signal amplitude in the circuit shown in FIG. 2 is determined by the resistor 6, the collector-emitter impedance of the transistor 13, and the impedance at the junction point of the resistors 2 and 3 to which the emitter of the transistor 13 is connected. Accordingly, the maximum degree of attenuation depends upon the impedance at the junction point of the resistors 2 and 3. For instance, assuming that the collector-emitter impedance of the transistor 13 has been reduced to zero by the gain control signal, (generated by circuit 10) substantially no input signal is fed to the amplifier 8 in the circuit shown in FIG. 1, but in the circuit shown in FIG. 2, an input signal attenuated by the ratio of the impedance of the resistor 6 to that at the junction point of the resistors 2 and 3 is supplied to the amplifier 8. In other words, the variation in the input signal having an amplitude above a certain level appears at the output terminal 9 as a variation in the output signal. Thus, the AGC circuit shown in FIG. 2 has a drawback that the gain control range is narrow.

DETAILED DESCRIPTION OF THE INVENTION

Figure 3:
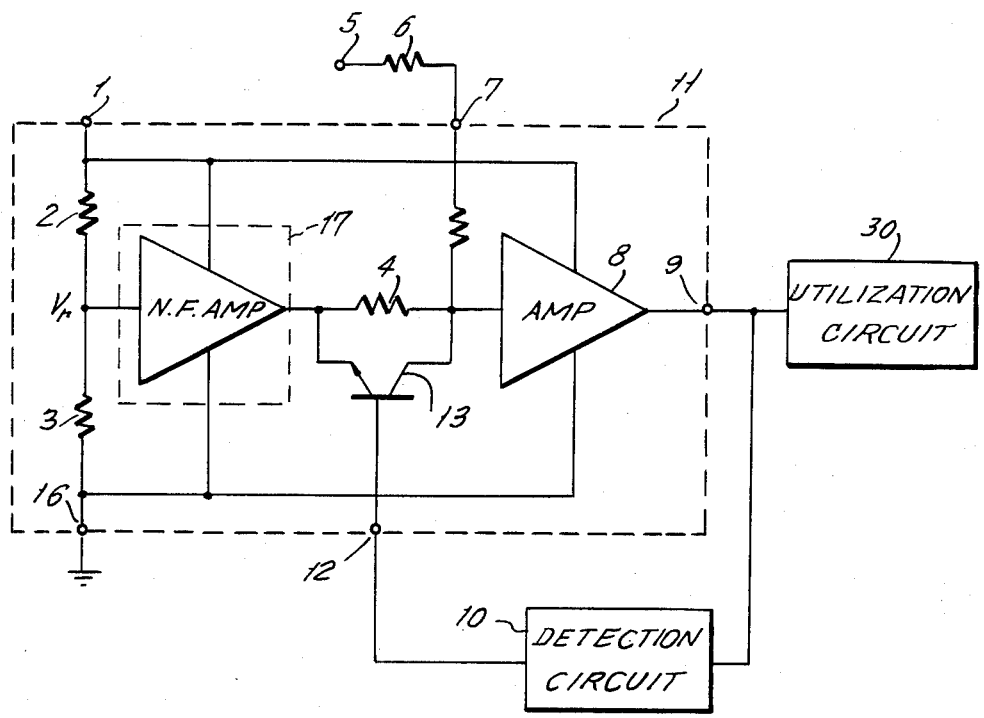
FIG. 3 is a circuit diagram of an AGC circuit according to a preferred embodiment of the present invention.

Referring now to FIG. 3, an embodiment of the present invention will be described. In this figure, component parts corresponding to those shown in FIGS. 1 and 2 are denoted by like reference numerals, and descriptions thereof will be omitted. A distinct difference from the circuit shown in FIG. 2 is that the AGC circuit according to the present invention comprises an additional amplifier which operates as an impedance conversion means 17 having an output impedance capable of sufficiently attenuating an A.C. signal supplied to its output end. The input end of the impedance conversion means 17 is connected to the reference voltage Vr at the node of the resistors 2 and 3. The output of the impedance conversion means 17 is connected to the input terminal 7 of the amplifier 8 via the resistor 4 to supply a voltage Vr corresponding to the reference voltage to the input terminal 7 of the amplifier 8 as a bias voltage. The collector (the one end) of the transistor 13 forming the variable impedance circuit is D.C. connected to the input terminal 7 of the amplifier 8, and its emitter (the other end) is connected to the output of the impedance conversion means 17. The output signal of the amplifier 8 is converted into a D.C. level (a gain control signal) corresponding to the amplitude of the output signal by means of the detection circuit 10, and the gain control signal is applied to the base (the control end) of the transistor 13 via the gain control terminal 12. The collector-emitter impedance of the transistor 13 is varied in response to the gain control signal applied to its base.

By employing a negative feedback amplifier of the parallel feedback type as the impedance conversion means 17, the amplifier 17 can present a low output impedance capable of sufficiently attenuating an A.C. signal at its output (which signal is the result of the input AC signal applied to input 5). As described hereinbefore, the negative feedback amplifier of the parallel feedback type has a relatively low output impedance, and its output impedance is further reduced with an increase in the amount of parallel feedback. Therefore, by giving an amplifier a negative feedback of the parallel feedback type, the emitter of the transistor 13 is substantially grounded with respect to an A.C. signal and the A.C. signal at the emitter of transistor 13 is sufficiently attenuated to disappear from the emitter. Consequently, the attenuation quantity of the variable attenuator formed of the resistor 6 and the transistor 13 is not influenced by the impedance at the junction point of the resistors 2 and 3. The A.C. impedance at the emitter of the transistor 13 is substantially zero. Therefore, if the collector-emitter impedance of the transistor 13 is reduced to the minimum value by the gain control signal fed to the base of the transistor 13, substantially no input signal is supplied to the input 7 of amplifier 8. In other words, a wide gain control range is presented which is similar to that of the circuit shown in FIG. 1.

It is obvious from the description relating to FIG. 2 that the input bias voltage to the amplifier 8 is not changed even if the collector of the transistor 13 is D.C. coupled to the input terminal 7.

As described above, the AGC circuit according to the present invention not only has a wide gain control range but also is less expensive and highly reliable. Moreover, the defining the impedance conversion means 17 may have a zero A.C. output impedance. In other words, the output voltage of the impedance conversion means 17 is a substantially constant D.C. voltage having no variation caused by an A.C. component of the input signal (at node 5) or the like. Accordingly, bias voltages applied to elements contained in the amplifier 8 may be produced from the output end of the impedance conversion means 17. In the circuit shown in FIGS. 1 and 2, the reference voltage Vr generated at the junction point of the resistors 2 and 3 would be varied by the input signal and accordingly, in order to apply bias voltages to other elements from the junction point of the resistors 2 and 3, it is necessary to connect a decoupling capacitor to the junction point. To provide a capacitor results in increase in externally provided parts and external lead terminals. In contrast, the output end of the impedance conversion means 17 can be used, according to the present invention, as a reference voltage point from which a bias voltage is derived to another circuit element without the use of a decoupling capacitor.

It is to be noted that in FIG. 3, the resistor 4 is provided for the purpose of applying a bias voltage to the amplifier 8 even when the transistor 13 is in a cut-off condition. Hence, the resistor 4 may be omitted when the transistor 13 is always used in an active region.

Figure 4:
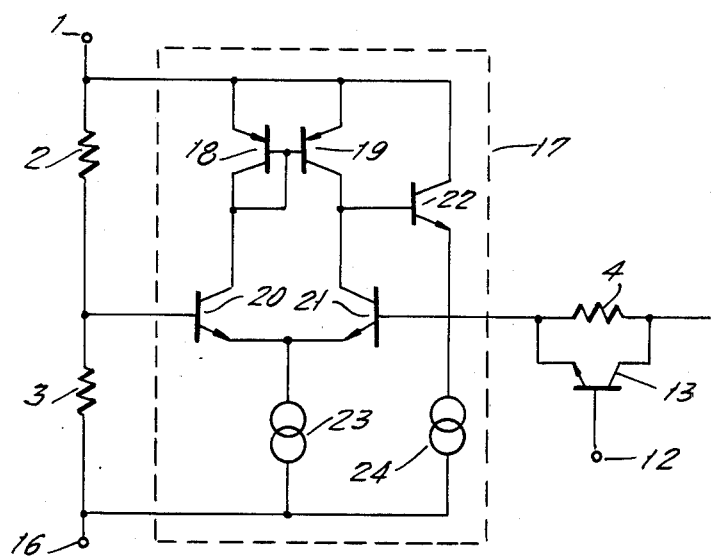
FIG. 4 is a circuit diagram showing one example of a negative feedback amplifier of the parallel feedback type to be used in the circuit of FIG. 3.

FIG. 4 illustrates one example of the additional impedance conversion means 17 of FIG. 3. The impedance conversion means 17 is composed of five transistors 18 to 22 and two constant current sources 23 and 24. The transistors 20 and 21 form a differential amplifier. The base of the transistor 20 is connected to the junction point of resistors 2 and 3. The constant current source 23 serves as a current source of the differential amplifier formed of the transistors 20 and 21. The transistors 18 and 19 constitute a current-mirror circuit and serve as the loads of the transistors 20 and 21. The collector output of the transistor 21 is supplied to the transistor 22 of an emitter follower type. The constant current source 24 serves as the load of the transistor 22. The emitter of the transistor 22 serves as the output end of the impedance conversion means 17 and is connected to the resistor 4 and the emitter of transistor 13. The emitter of the transistor 22 is further connected to the base of the transistor 21. In other words, the output signal of the impedance conversion means 17 is totally fed back to the input side to achieve 100% feedback. Further, transistors 20 and 21 constitute the differential amplifier, and therefore, a signal having a phase opposite to that of the output signal is fed back. That is, a negative feedback is given. Furthermore, the feedback signal is derived from the node between the transistor 22 and its load (constant current source 24). That is, the parallel feedback is established. Accordingly, the impedance conversion means 17 shown in FIG. 4 is a negative feedback amplifier of the parallel feedback type, and operates as a total feedback amplifie (a voltage follower). Consequently, the output impedance of the amplifier 17 is substantially zero. In other words, the emitter of the transistor 13 is in a grounded condition with respect to an A.C. signal. Therefore, the AGC circuit having the impedance conversion means 17 shown in FIG. 4 attains a gain control operation over a wide range. Since the gain of the total feedback amplifier is one, there appears at the emitter of the transistor 22 a voltage substantially equal to the base voltage Vr of the transistor 20, i.e., the reference voltage at the junction point between the resistors 2 and 3. Accordingly, the bias voltage to the amplifier 8 is substantially determined by the resistors 2 and 3. In other words, the use of the total feedback amplifier as the impedance conversion means 17 is advantageous to the establishment of a bias voltage. Since the A.C. output impedance of the impedance conversion means 17 shown in FIG. 4 is substantially zero, the output voltage of the impedance conversion means 17 can be utilized as bias voltages to other elements without the need for de-coupling capacitors.

As described above, the AGC circuit according to the present invention is suitable for an integrated circuit since the number of externally provided parts and/or external lead terminals is decreased. Further, the circuit also has a sufficiently wide gain control range.

As the signal amplifier 8, a well-known single-ended push-pull amplifier, direct-coupled multi-stage A-class amplifier, or the like may be employed. The detection circuit 10 can be constituted by using a detector element such as a diode, a voltage holding element such as a capacitor, etc.

A major feature of the present invention is that a variable impedance circuit is connected between a signal amplifier and a reference voltage generation circuit through an additional amplifier having a sufficient low A.C. output impedance, and therefore, the present invention is not limited to the described embodiment. For example, the variable impedance circuit may be constituted by a unipolar transistor, or a plurality of bipolar and/or unipolar transistors. Active elements such as diode, transistor, etc. may be employed to constitute a reference voltage generation circuit, instead of or in addition to the resistors 2 and 3. Unless the maximum amplitude of the input signal is so large, it is allowable that the A.C. output impedance of the impedance conversion means 17 is not zero. In other words, it is unnecessary to give a 100% negative feedback to the impedance conversion means 17. However, from a viewpoint of the establishment of an input bias voltage and a gain control range, it is favorable to employ a total feedback impedance conversion means as the amplifier 17. The transistors 18 and 19 are of PNP type and the transistors 20 to 21 are of NPN type, but the respective transistors may have the opposite conductivity types. The transistors 18 and 19 constitute an active load, but a passive load using resistors is also applicable. Though the output stage of the impedance conversion means 17 is formed by one transistor 22 of an emitter follow type, a plurality of transistor stages can be used as the output stage.

What is claimed is:

1. A gain control circuit comprising: a signal amplifier having an input terminal and amplifying an input signal supplied to said input terminal; variable impedance means having a first terminal coupled to said input terminal of said signal amplifier, a second terminal, and a control terminal, an impedance between said first and second terminals of said variable impedance means being varied in response to a gain control signal supplied to said control terminal; means responsive to an output signal of said signal amplifier for producing said gain control signal; a reference voltage generation means for generating a reference voltage at its output end, said output end having a first impedance; a negative feedback amplifier having an input end connected to said output end of said reference voltage generation means and an output end coupled to the second terminal of said variable impedance means, said negative feedback amplifier having a gain of 1 to produce at its output end a bias voltage that is substantially equal to said reference voltage, said output end of said negative feedback amplifier having an impedance which is lower than said first impedance of said output end of said reference voltage generating means; and a bias voltage supplying means coupled between the output end of said negative feedback amplifier and the input terminal of said signal amplifier.

2. A gain control circuit claimed in claim 1, wherein said variable impedance means comprises a transistor having a base, a collector and an emitter connected to said control terminal, said first terminal, and said second terminal, respectively, and said input signal is supplied to said input terminal through a resistor, said input signal being attenuated in accordance with a ratio in the impedance between said variable impedance means and said resistor.

3. A gain control circuit claimed in claim 1, wherein said bias voltage supplying means includes a resistor connected between said first and second terminals of said variable impedance means, whereby a bias voltage is supplied to said amplifier even when said transistor is in a cut-off condition.

4. A gain control circuit claimed in claim 1, wherein said additional amplifier comprises an input stage and an output stage, a negative feedback signal being derived in parallel from said output stage and fed back to said input stage to reduce an alternating current output impedance of said additional amplifier.

5. A circuit compising: first and second power supply terminals; an input terminal; an output terminal; a signal amplifier amplifying an input signal supplied to said input terminal and generating an output signal supplied to said input terminal and generating an output signal at said output terminal; means coupled between said first and second power supply terminals for generating a reference voltage; means responsive to said reference voltage for creating at its output end a bias voltage relative to said reference voltage with an output A.C. impedance lower than that of said generating means; means coupled to said output terminal for producing a control signal corresponding to an amplitude of said output signal; and means coupled between said input terminal and said output end of said creating means for varying an impedance between said input terminal and said output end in response to said control signal.

6. A circuit claimed in claim 5, wherein said creating means comprises a voltage follower and said varying means comprises a transistor having a control electrode supplied with said control signal, a first electrode coupled to said input terminal and a second electrode coupled to said output end.

7. A circuit claimed in claim 5, wherein said creating means includes a first nd a second transistors constituting a differential amplifier to serve as an input state of said creating means, a third and a fourth transistors constituting a load circuit of said differential amplifier, and a fifth transistor serving as an output stage of said creating means, a base of said first transistor being connected to said input end, and a base of said second transistor being connected to said output end to perform a 100% negative feedback.

8. A circuit comprising: an amplifier amplifying an input signal supplied thereto and producing an output signal; means for generating a reference voltage; means coupled to said amplifier for changing a level of said input signal in response to a control signal applied thereto; a first transistor supplied with said reference voltage; a second transistor cooperating with said first transistor to define a differential amplifier; a third transistor of an emitter follower type transferring an output of said differential amplifier to said changing means and said second transistor whereby the voltage supplied to said changing means becomes substantially equal to said reference voltage.

9. A circuit comprising: an amplifier amplifying an input signal supplied thereto; first and second resistors connected in series and generating a bias voltage at a connection point thereof; a first current source; a first transistor having a base connected to said connection point of said first and second resistors, an emitter connected to said first current source and a collector; a second transistor having a base, an emitter connected to the emitter of said first transistor and a collector; a load circuit connected to the collectors of said first and second transistors; a third transistor having a base and an emitter connected to the collector and the base of said second transistor, respectively; a second current source connected to the emitter of said third transistor; means responsive to an output signal of said amplifier for producing a gain control signal; and means coupled between the emitter of said third transistor and said amplifier for varying a level of said input signal in response to said gain control signal.

* * * * *